United States Patent
Dotson et al.

(10) Patent No.: US 8,020,134 B2
(45) Date of Patent: Sep. 13, 2011

(54) METHOD AND APPARATUS FOR PARALLEL PROCESSING OF SEMICONDUCTOR CHIP DESIGNS

(75) Inventors: Michael W. Dotson, Binghamton, NY (US); Anthony DeGroff Drumm, Rochester, MN (US); Dazhuang J. Ma, White Plains, NY (US); Ruchir Puri, Baldwin Place, NY (US); Louise H. Trevillyan, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 792 days.

(21) Appl. No.: 12/035,950

(22) Filed: Feb. 22, 2008

(65) Prior Publication Data

US 2009/0217227 A1    Aug. 27, 2009

(51) Int. Cl.
*G06F 17/50* (2006.01)
(52) U.S. Cl. .................................. 716/124; 716/125
(58) Field of Classification Search ........... 716/118–125
See application file for complete search history.

(56) References Cited

U.S. PATENT DOCUMENTS

| | | | |
|---|---|---|---|
| 5,745,363 A | 4/1998 | Rostoker et al. | |
| 5,781,439 A | 7/1998 | Rostoker et al. | |
| 5,796,625 A | 8/1998 | Scepanovic et al. | |
| 5,815,403 A | 9/1998 | Jones et al. | |
| 5,903,461 A | 5/1999 | Rostoker et al. | |
| 5,909,376 A | 6/1999 | Scepanovic et al. | |
| 6,038,385 A | 3/2000 | Scepanovic et al. | |
| 6,099,580 A | 8/2000 | Boyle et al. | |
| 6,154,874 A * | 11/2000 | Scepanovic et al. | 716/129 |
| 6,487,706 B1 | 11/2002 | Barkley et al. | |
| 6,615,167 B1 | 9/2003 | Devins et al. | |
| 2003/0084416 A1 * | 5/2003 | Dai et al. | 716/7 |

OTHER PUBLICATIONS

Hong Yu, MMP: A Novel Placement Algorithum for Combined Macro Block and Standard Cell Layout Design, Department of Computer Science and Technology, Tsinghua University, Beijing 100084, P.R. China, 2000 IEEE.

* cited by examiner

Primary Examiner — Jack Chiang
Assistant Examiner — Binh C Tat

(57) ABSTRACT

In one embodiment, the invention is a method and apparatus for parallel processing of semiconductor chip designs. One embodiment of a method for processing a semiconductor chip design includes flattening a netlist corresponding to the semiconductor chip design, performing logic clustering on one or more logic elements incorporated in the flattened netlist to generate one or more clusters, partitioning the semiconductor chip design in accordance with the one or more clusters, and designing the individual partitions in parallel.

14 Claims, 4 Drawing Sheets

METHOD AND APPARATUS FOR PARALLEL PROCESSING OF SEMICONDUCTOR CHIP DESIGNS

BACKGROUND OF THE INVENTION

The present invention relates generally to design automation, and relates more particularly to parallel processing of very large-scale complex semiconductor chip designs.

Design automation has conventionally been performed using computer software executed on a single processor, usually in a "flat" fashion where an entire semiconductor chip design is processed at the same level at once. Although this may achieve good semiconductor chip quality through global consideration of the entire semiconductor chip design, the process is clearly limited by the speed and power of the single computer used for processing.

By contrast, each processor in a parallel processing scheme sees only a portion of the entire semiconductor chip design after partitioning. Such a processing scheme makes the accommodation of engineering changes more complicated, however, because modifications in one partition will likely affect the partition's timing behavior and, in turn, ripple the effect to other partitions. Thus, a local change may entail a more global (and potentially unpredictable and negative) impact on the semiconductor chip design. This would defeat the purpose of the parallel processing scheme.

Thus, there is a need in the art for a method and apparatus for parallel processing of semiconductor chip designs.

SUMMARY OF THE INVENTION

In one embodiment, the invention is a method and apparatus for parallel processing of semiconductor chip designs. One embodiment of a method for processing a semiconductor chip design includes flattening a netlist corresponding to the semiconductor chip design, performing logic clustering on one or more logic elements incorporated in the flattened netlist to generate one or more clusters, partitioning the semiconductor chip design in accordance with the one or more clusters, and designing the individual partitions in parallel.

BRIEF DESCRIPTION OF THE DRAWINGS

So that the manner in which the above recited features of the present invention can be understood in detail, a more particular description of the invention, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In one embodiment, the present invention is a method and apparatus for parallel processing of semiconductor chip designs. Embodiments of the invention employ a two-phase parallel processing system that first clusters logic elements in a semiconductor chip design and then partitions the semiconductor chip design based on the clusters. Each cluster generated in the clustering phase is endpoint-bounded, and the interactions (in terms of intra-cluster net crossings) between partitions generated in the partitioning phase are minimized, thereby shortening the parallel processing run time without sacrificing semiconductor chip quality.

Figure 1:
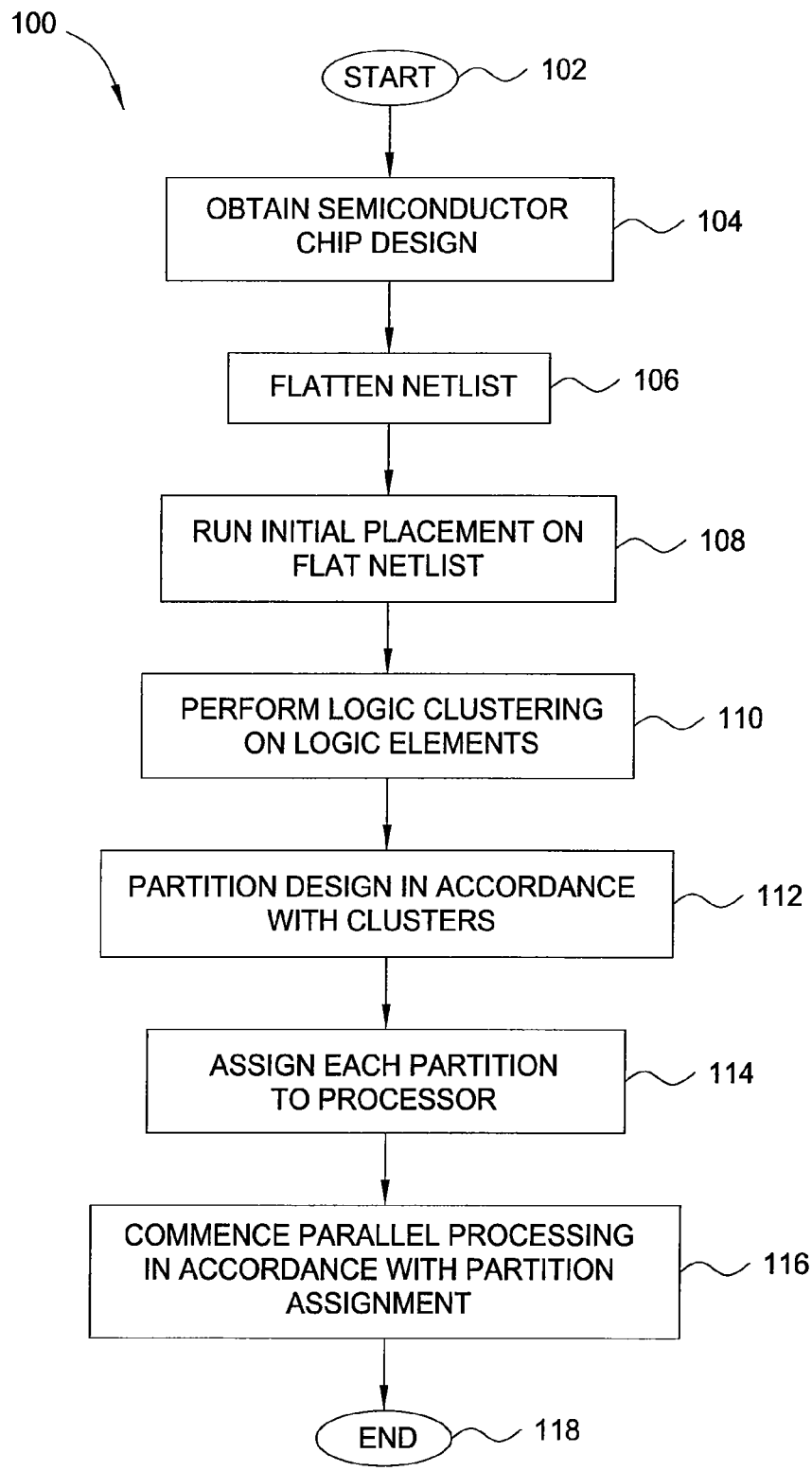
FIG. 1 is a flow diagram illustrating one embodiment of a method for parallel processing of a semiconductor chip design, according to the present invention.

FIG. 1 is a flow diagram illustrating one embodiment of a method 100 for parallel processing of a semiconductor chip design, according to the present invention.

The method 100 is initialized at step 102 and proceeds to step 104, where the method 100 obtains the complete semiconductor chip design to be analyzed. The method 100 then proceeds to step 106 and flattens the netlist corresponding to the semiconductor chip design. The netlist comprises a description of the logical components and interconnects in the semiconductor chip design. The method 100 then runs an initial placement of the components and interconnects in the flat netlist in step 108. That is, the method 100 arranges the components and interconnects on the silicon in order to optimize certain objectives.

In step 110, the method 100 performs logic clustering on the logic elements in the netlist. In one embodiment, logic clustering is performed by grouping together logic elements that are connected, by searching in either forward or backward signal direction, without reaching an end point (e.g., a latch, a flip-flop, a fixed object whose location on the semiconductor chip design is predetermined, such as an input/output array, etc.). In one embodiment, "special" nets (e.g., power/ground, clock, large fan-out, etc.) are excluded from the grouping. This clustering approach minimizes interactions among the clusters.

Figure 2:
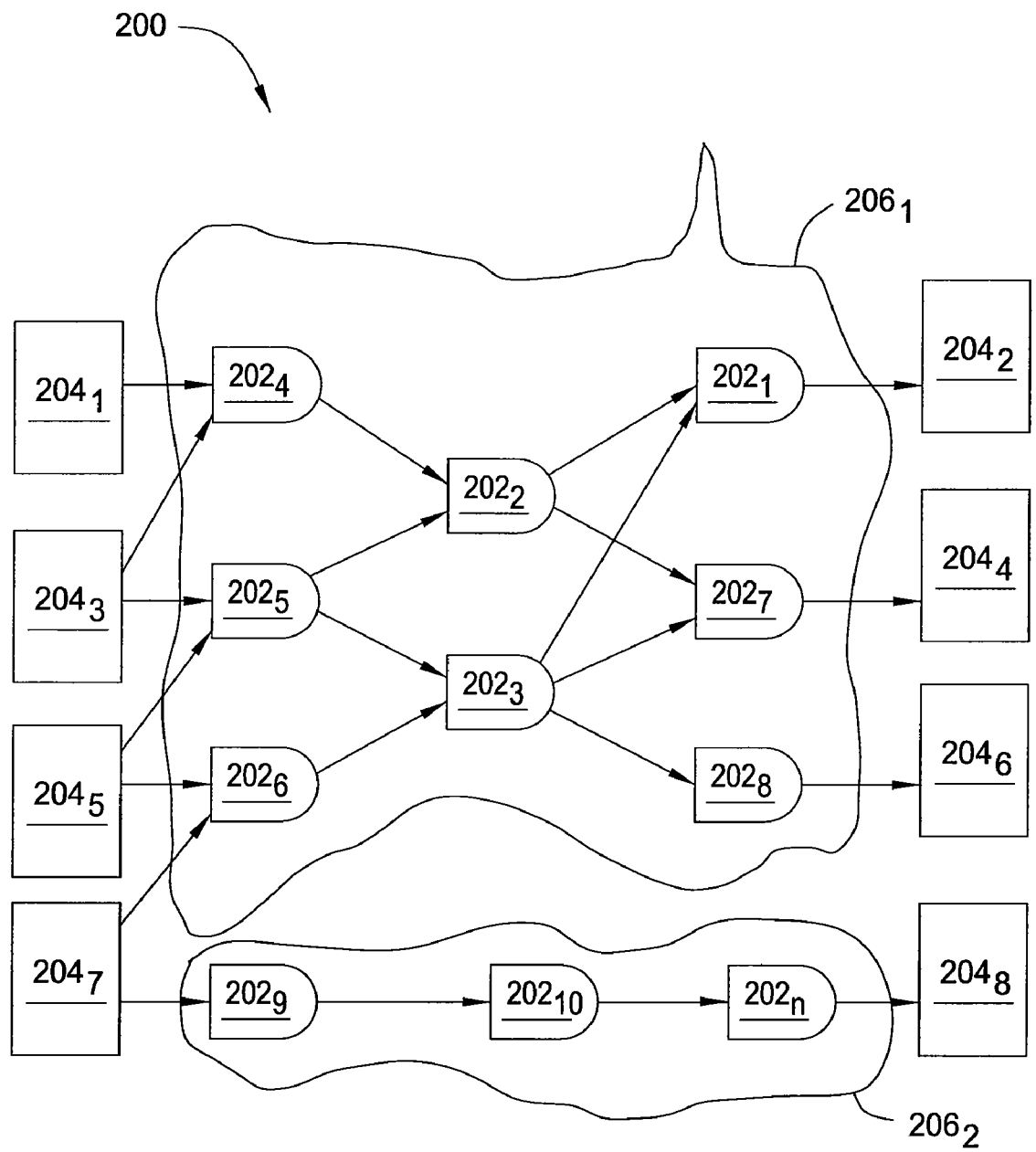
FIG. 2 is a schematic diagram illustrating an exemplary semiconductor chip design.

FIG. 2, for example, is a schematic diagram illustrating an exemplary semiconductor chip design 200. As illustrated, the semiconductor chip design 200 comprises a plurality of logic elements $202_1$-$202_n$ (hereinafter collectively referred to as "logic elements 202") and a plurality of endpoints $204_1$-$204_8$ (hereinafter collectively referred to as "endpoints 204"). Starting with any of the logic elements $202_1$-$202_8$, these eight particular logic elements 202 will all be reached, either forward or backward signal direction, in a first cluster $206_1$ completely bounded by the endpoints $204_1$-$204_6$. Similarly, the logic elements $202_9$-$202_{11}$ belong to a second cluster 2062 bounded by the endpoints $204_7$ and $204_8$.

An important design intuition behind the clustering step is the following: modern large-scale complex designs are typically delivered by multiple designers in the form of modules with clearly defined input/output properties (e.g., typically in terms of timing). These modules are often bounded by endpoints, and the sizes of the clusters therein remain substantially constant and insensitive to the increase in overall design size. That is, as the semiconductor chip design gets bigger, the number of "big" clusters (which typically account for about sixty percent of the total design) in the design may increase, but the actual sizes of the "big" clusters will remain substantially the same. Moreover, experimental results have shown that endpoint-bounded logic clusters such as those produced by the disclosed approach are also physically clustered in initial placement, which implies that subsequent partitioning based on such logic clusters should not perturb much of the initial placement.

In further embodiments, clustering in accordance with step 110 is performed in accordance with a different clustering method, such as a method based on logic hierarchy names or on operation frequency.

Referring back to FIG. 1, once the logic elements have been clustered accordingly, the method 100 proceeds to step 112 and partitions the semiconductor chip design in accordance with the clusters. In one embodiment, partitioning in step 112 is performed in accordance with a slicing-based greedy partitioning algorithm. The goal of the slicing-based greedy partitioning algorithm is to continually make the best cut (out of a plurality of potential cuts) in a largest region of the semiconductor chip design. The "best" cut is the cut that crosses the fewest number of nets.

Figure 3:
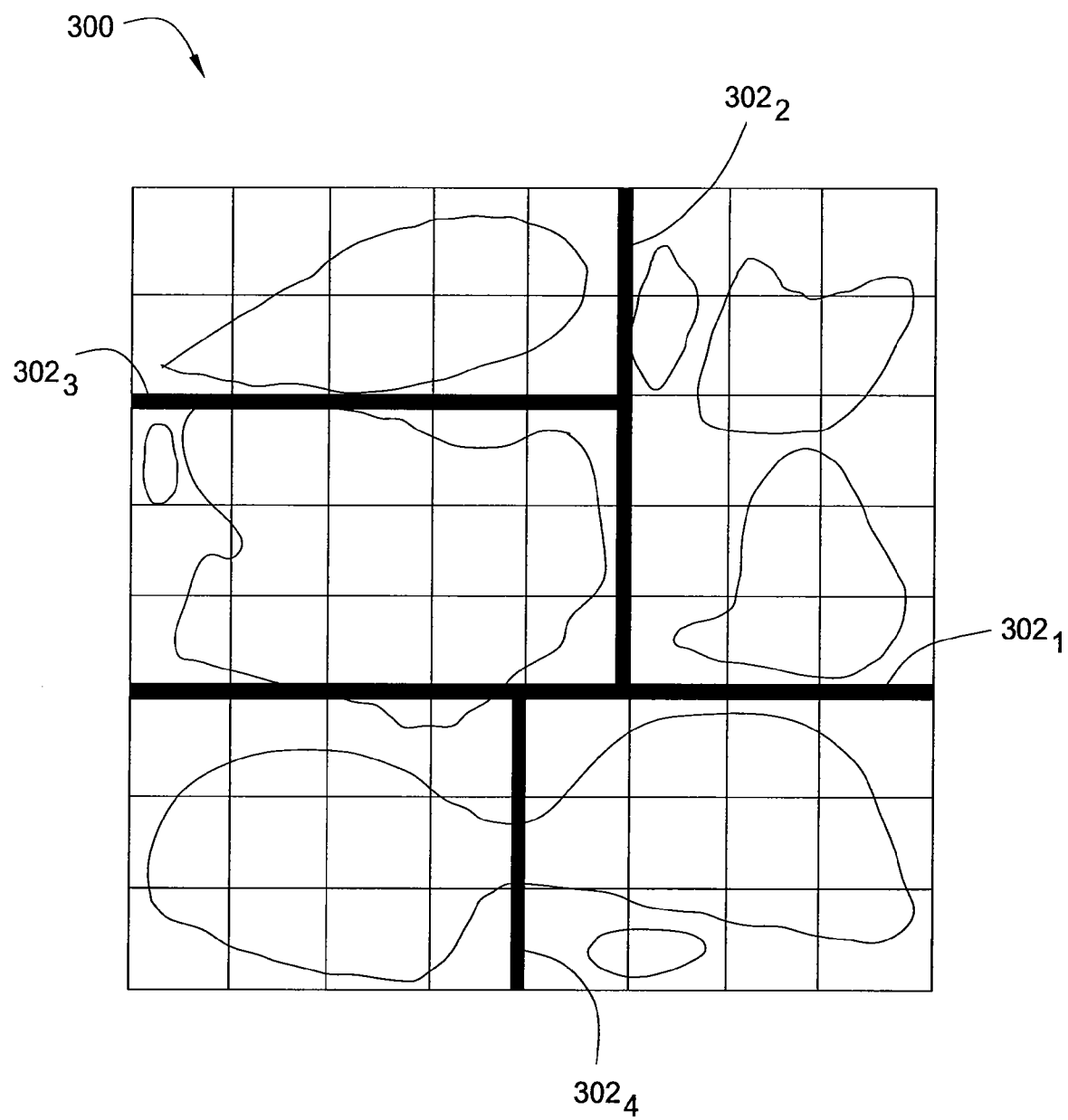
FIG. 3 is a schematic diagram illustrating an exemplary semiconductor chip design that has been partitioned using a slicing-based greedy algorithm.

FIG. 3, for example, is a schematic diagram illustrating an exemplary semiconductor chip design 300 that has been partitioned using a slicing-based greedy algorithm. As illustrated, the placement image of the semiconductor chip design 300 is first discretized into a plurality of grids. The slicing-based greedy algorithm then iteratively bisects the semiconductor chip design 300 in the then largest region at the time of bisecting, with cut lines aligned on the grid lines, until a predefined number of partitions is obtained. At each cut, the slicing-based greedy algorithm finds the best feasible solution, in a greedy fashion, among all possible cuts. For example, a first cut $302_1$ is selected as the best cut among seven horizontal cuts and seven vertical cuts. The second cut $302_2$ is then selected as the best cut, in the now largest region of the grid, from among seven potential horizontal cuts and four potential vertical cuts. The third cut $302_3$ is next selected as the best cut, in the now largest region of the grid, from among eight potential cuts. Finally, the fourth cut $302_4$ is selected as the best cut, in the now largest region of the grid, from among nine potential cuts.

In one embodiment, the objective of the partitioning step is to minimize the total intra-cluster net crossings (i.e., to minimize the number of crossings for those nets that are within the same endpoint-bounded cluster, but cross different partitions). For example, in FIG. 3, each cut tries not to intersect a cluster; if intersection of a cluster cannot be avoided, the intersection is at least minimized. In one embodiment, the constraints include at least one or more of: the lower and upper bounds for the number of logic elements in a single partition, the aspect ratio for each partition (e.g., where the partitions are generally rectangular in shape), or an upper bound of the ratio of the total silicon area consumed by the logic elements in a partition to the available "image" area of the partition.

In one further embodiment, the partitioning step stores, at each cut, all of the possible cuts that could have been made (e.g., as opposed to storing just the cut that was actually made). This allows for revision of the partitioning at a later time. For example, if the partitioning algorithm is too greedy, a "best" cut made earlier in time may later be determined to be the most optimal cut (e.g., the second best cut may actually be better), considering the combined cost of all of the cuts.

Referring back to FIG. 1, once the partitioning is completed, the method 100 proceeds to step 114 and assigns each of the resultant partitions to a processor. The method 100 then proceeds to step 116 and commences parallel processing in accordance with the partition assignments (i.e., the remainder of the physical synthesis process for processing of the semiconductor chip design is run on each processor in parallel). The method 100 then terminates in step 118.

Because each cluster defined in the clustering step is endpoint-bounded, and because the interactions between partitions (in terms of intra-cluster net crossings) are minimized in the partitioning step, the subsequent parallel processing substantially shortens the typical run time and achieves good semiconductor chip quality. Placement of components and interconnects in each partition may be redone to achieve a more optimal arrangement based on results of the parallel processing.

Figure 4:
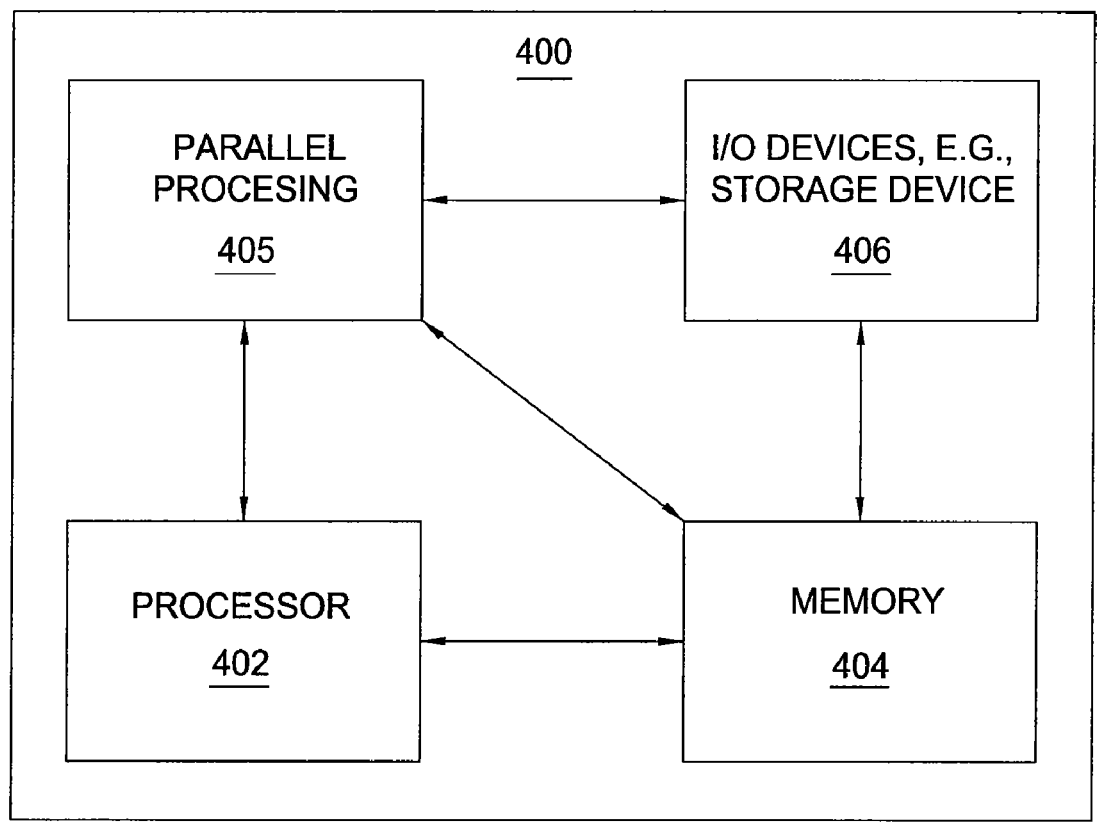
FIG. 4 is a high level block diagram of the present parallel processing method that is implemented using a general purpose computing device.

FIG. 4 is a high level block diagram of the present parallel processing method that is implemented using a general purpose computing device 400. In one embodiment, a general purpose computing device 400 comprises a processor 402, a memory 404, a parallel processing module 405 and various input/output (I/O) devices 406 such as a display, a keyboard, a mouse, a modem, a network connection and the like. In one embodiment, at least one I/O device is a storage device (e.g., a disk drive, an optical disk drive, a floppy disk drive). It should be understood that the parallel processing module 405 can be implemented as a physical device or subsystem that is coupled to a processor through a communication channel.

Alternatively, the parallel processing module 405 can be represented by one or more software applications (or even a combination of software and hardware, e.g., using Application Specific Integrated Circuits (ASIC)), where the software is loaded from a storage medium (e.g., I/O devices 406) and operated by the processor 402 in the memory 404 of the general purpose computing device 400. Additionally, the software may run in a distributed or partitioned fashion on two or more computing devices similar to the general purpose computing device 400. Thus, in one embodiment, the parallel processing module 405 for processing semiconductor chip designs described herein with reference to the preceding figures can be stored on a computer readable medium or carrier (e.g., RAM, magnetic or optical drive or diskette, and the like).

It should be noted that although not explicitly specified, one or more steps of the methods described herein may include a storing, displaying and/or outputting step as required for a particular application. In other words, any data, records, fields, and/or intermediate results discussed in the methods can be stored, displayed, and/or outputted to another device as required for a particular application. Furthermore, steps or blocks in the accompanying Figures that recite a determining operation or involve a decision, do not necessarily require that both branches of the determining operation be practiced. In other words, one of the branches of the determining operation can be deemed as an optional step.

While the foregoing is directed to embodiments of the present invention, other and further embodiments of the invention may be devised without departing from the basic scope thereof. Various embodiments presented herein, or portions thereof, may be combined to create further embodiments. Furthermore, terms such as top, side, bottom, front, back, and the like are relative or positional terms and are used with respect to the exemplary embodiments illustrated in the figures, and as such these terms may be interchangeable.

What is claimed is:

1. A method for processing a semiconductor chip design, comprising:

flattening a netlist corresponding to the semiconductor chip design to produce a flattened netlist, wherein the flattened netlist comprises a plurality of logic elements and a plurality of interconnects;

constructing an initial placement of the plurality of logic elements and the plurality of interconnects on a silicon substrate;

performing logic clustering on the plurality of logic elements to generate one or more clusters, wherein the logic clustering is performed subsequently to the constructing; and partitioning the semiconductor chip design in accordance with the one or more clusters to form at least two partitions wherein the partitioning is performed in accordance with a slicing-based greedy algorithm that performs steps comprising:
discretizing a placement image of the semiconductor chip design into a plurality of grids;
iteratively bisecting the placement image in a biggest region at a time of the bisecting until a predefined number of partitions is obtained,
wherein at least one of: the flattening, the constructing, the performing logic clustering, or the partitioning is performed using a processor.

2. The method of claim 1, further comprising:
assigning each of the at least two partitions to a processor selected from a group of processors, such that the at least two partitions are assigned among at least two processors; and
processing each of the at least two partitions on the at least two processors in a parallel fashion.

3. The method of claim 1, wherein the performing logic clustering comprises:
grouping those of the plurality of logic elements that are connected, by searching in either a forward signal direction or a backward signal direction, without reaching an endpoint in the flattened netlist.

4. The method of claim 3, wherein said endpoint comprises at least one of: a latch, a flip-flop, or a fixed object.

5. The method of claim 3, wherein the grouping excludes power/ground nets, clock nets, and large fan-out nets.

6. The method of claim 1, wherein the clustering is performed in accordance with at least one of: logic hierarchy names or operation frequency.

7. The method of claim 1, wherein the bisecting comprises: forming cut lines along lines of the plurality of grids.

8. The method of claim 1, wherein the bisecting selects a best cut from among one or more potential cuts.

9. The method of claim 8, further comprising:
storing the best cut.

10. The method of claim 8, further comprising:
storing the one or more potential cuts.

11. The method of claim 1, wherein the partitioning minimizes a total number of intra-cluster net crossings.

12. The method of claim 1, wherein one or more constraints on the partitioning comprise at least one of: a lower bound for a number of logic elements in a single one of the one or more at least two partitions, an upper bound for the number of logic elements in a single one of the at least two partitions, an aspect ratio for each of the at least two partitions, or an upper bound of a ratio of a total silicon area consumed by those of the plurality of logic elements that are contained in one of the at least two partitions to an available "image" area of the one of the at least two partitions.

13. Computing device containing an executable program for processing a semiconductor chip design, where the program performs the steps of:
flattening a netlist corresponding to the semiconductor chip design to produce a flattened netlist, wherein the flattened netlist comprises a plurality of logic elements and a plurality of interconnects;
constructing an initial placement of the plurality of logic elements and the plurality of interconnects on a silicon substrate;
performing logic clustering on the plurality of logic elements to generate one or more clusters, wherein the logic clustering is performed subsequently to the constructing; and
partitioning the semiconductor chip design in accordance with the one or more clusters to form at least two partitions wherein the partitioning is performed in accordance with a slicing-based greedy algorithm that performs steps comprising:
discretizing a placement image of the semiconductor chip design into a plurality of grids;
iteratively bisecting the placement image in a biggest region at a time of the bisecting until a predefined number of partitions is obtained.

14. Apparatus for processing a semiconductor chip design, comprising:
means for flattening a netlist corresponding to the semiconductor chip design to produce a flattened netlist, wherein the flattened netlist comprises a plurality of logic elements and a plurality of interconnects;
means for constructing an initial placement of the plurality of logic elements and the plurality of interconnects on a silicon substrate;
means for performing logic clustering on the plurality of logic elements to generate one or more clusters, wherein the logic clustering is performed subsequently to the constructing; and
means for partitioning the semiconductor chip design in accordance with the one or more clusters to form at least two partitions wherein the partitioning is performed in accordance with a slicing-based greedy algorithm that performs steps comprising:
discretizing a placement image of the semiconductor chip design into a plurality of grids;
iteratively bisecting the placement image in a biggest region at a time of the bisecting until a predefined number of partitions is obtained.

* * * * *